United States Patent
Kim et al.

(10) Patent No.: US 9,685,136 B2
(45) Date of Patent: Jun. 20, 2017

(54) DISPLAY SYSTEM AND CONVERSION APPARATUS

(71) Applicant: SAMSUNG ELECTRONICS CO., LTD., Suwon-si (KR)

(72) Inventors: In-beom Kim, Suwon-si (KR); Seok-woo Yong, Seoul (KR); Soo-hyun Um, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/857,888

(22) Filed: Sep. 18, 2015

(65) Prior Publication Data

US 2016/0125835 A1    May 5, 2016

(30) Foreign Application Priority Data

Oct. 30, 2014  (KR) .................. 10-2014-0149312

(51) Int. Cl.
G09G 5/00 (2006.01)
H03M 9/00 (2006.01)

(52) U.S. Cl.
CPC .............. *G09G 5/006* (2013.01); *H03M 9/00* (2013.01); *G09G 2320/0209* (2013.01); *G09G 2350/00* (2013.01); *G09G 2370/12* (2013.01)

(58) Field of Classification Search
CPC .............. G09G 5/006; G09G 2350/00; G09G 2370/12; G09G 2320/0209; H03M 9/00
See application file for complete search history.

(56) References Cited

U.S. PATENT DOCUMENTS

| | | | |
|---|---|---|---|
| 2004/0263686 A1* | 12/2004 | Kim | H04N 5/44591 348/556 |
| 2007/0200218 A1* | 8/2007 | Mukaibara | H05K 1/0233 257/691 |
| 2009/0022176 A1* | 1/2009 | Nguyen | G09G 5/006 370/466 |
| 2009/0172759 A1 | 7/2009 | Jung | |
| 2010/0013547 A1* | 1/2010 | Oka | H03K 19/0013 327/530 |
| 2010/0014007 A1* | 1/2010 | Kotani | G06F 3/1423 348/744 |
| 2010/0318697 A1 | 12/2010 | Siulinski et al. | |

(Continued)

FOREIGN PATENT DOCUMENTS

EP    2760148 A1    7/2014

OTHER PUBLICATIONS

Communication issued Feb. 10, 2016, issued by the European Patent Office in counterpart European Patent Application No. 15186525.0.

*Primary Examiner* — Idriss N Alrobaye
*Assistant Examiner* — Ronald Modo
(74) *Attorney, Agent, or Firm* — Sughrue Mion, PLLC

(57) ABSTRACT

A display system and a conversion apparatus are provided. The display system includes an image signal input apparatus configured to convert a first parallel image signal to a serial image signal, a conversion apparatus configured to convert the serial image signal to a second parallel image signal, and a display apparatus configured to process the second parallel image signal, and display the processed second parallel image signal. The conversion apparatus is attachable to and detachable from the display apparatus.

20 Claims, 5 Drawing Sheets

(56) References Cited

U.S. PATENT DOCUMENTS

| | | | | |
|---|---|---|---|---|
| 2011/0260318 A1* | 10/2011 | Eisenstadt | ........... | G06F 17/5054 257/737 |
| 2013/0324165 A1* | 12/2013 | Fujiwara | ............... | H04W 12/06 455/457 |
| 2015/0349763 A1* | 12/2015 | Luo | ........................ | H03K 5/131 327/231 |

* cited by examiner

DISPLAY SYSTEM AND CONVERSION APPARATUS

CROSS-REFERENCE TO RELATED APPLICATION

This application claims priority from Korean Patent Application No. 10-2014-0149312, filed on Oct. 30, 2014, in the Korean Intellectual Property Office, the disclosure of which is incorporated herein by reference in its entirety.

BACKGROUND

1. Field

Apparatuses and methods consistent with exemplary embodiments relate to a display system and a conversion apparatus.

2. Description of the Related Art

With the development of electronic technology, display apparatuses may receive various types of image signals. For example, various external apparatuses such as a digital versatile disc (DVD) player, a Universal Serial Bus (USB) apparatus, or an audio system may be coupled to a display apparatus, and thus the utility of the display apparatus has been increased. Thus, input terminals of various standards that are connectable to the various external apparatuses are provided in the display apparatus.

However, there are factors that cause inconveniences for users in that connection lines are complex in response to a plurality of external apparatuses being coupled to the display apparatus, and the external apparatuses may have to be coupled to the input terminals provided in a rear of the display apparatus. Therefore, there is a need for a method for coupling the external apparatuses to the display apparatus through only one line by providing a separate image signal input apparatus.

A plurality of inputs may be processed using a Serializer/Deserializer (SerDes) communication circuit for high-speed communication. In this case, mutual crosstalk is caused since the SerDes communication circuit for high-speed communication and a basic circuit of the display apparatus are designed on the same substrate in the related art. Power noise on the substrate affects the SerDes communication circuit, and thus communication interference or cutoff is caused. Further, communication signals on the basic circuit are disturbed due to the effect of a SerDes signal, a clock, and the like.

SUMMARY

Exemplary embodiments address at least the above disadvantages and other disadvantages not described above. Also, the exemplary embodiments are not required to overcome the disadvantages described above, and may not overcome any of the problems described above.

Exemplary embodiments provide a conversion apparatus of which an apparatus for high-speed communication is separately modularized, and a display system.

According to an aspect of an exemplary embodiment, there is provided a display system including an image signal input apparatus configured to convert a first parallel image signal to a serial image signal, a conversion apparatus configured to convert the serial image signal to a second parallel image signal, and a display apparatus configured to process the second parallel image signal, and display the processed second parallel image signal. The conversion apparatus is attachable to and detachable from the display apparatus.

The conversion apparatus may include a first connector configured to be coupled to the display apparatus. The conversion apparatus may further include a second connector configured to be coupled to the image signal input apparatus, and receive the serial image signal from the image signal input apparatus. The conversion apparatus may further include a serializer/deserializer (SerDes) configured to convert the serial image signal to the second parallel image signal. The first connector may be further configured to transmit the second parallel image signal to the display apparatus.

The conversion apparatus may further include power supplies configured to supply powers to the first connector, the second connector, and the SerDes.

The power supplies may be separated by a bead.

The powers may have respective voltages differently set from each other, and the SerDes may be configured to select one of the power supplies configured to supply a power having a voltage based on a processing function of the SerDes, and receive the power having the voltage from the selected one of the power supplies.

The first connector may be configured to perform low-speed communication of less than 1 GHz, and the second connector may be configured to perform high-speed communication of 5 GHz or more.

The low-speed communication may be any one or any combination of VX1 communication, inter-integrated circuit communication, universal asynchronous receiver/transmitter communication, general purpose input/output communication, and transition-minimized differential signaling communication.

The display apparatus may include image input terminals configured to be disabled in response to the conversion apparatus being attached to the display apparatus, and be enabled in response to the conversion apparatus being detached from the display apparatus.

The image signal input apparatus may be configured to control all of operations of the display system, and the display apparatus may be configured to control less than all of the operations of the display system, in response to the conversion apparatus being attached to the display apparatus.

According to an aspect of an exemplary embodiment, there is provided a conversion apparatus including a first connector configured to be coupled to a display apparatus. The conversion apparatus further includes a second connector configured to be coupled to an image signal input apparatus, and receive a serial image signal from the image signal input apparatus. The conversion apparatus further includes a serializer/deserializer (SerDes) configured to convert the serial image signal to a parallel image signal. The first connector is further configured to transmit the parallel image signal to the display apparatus, and the conversion apparatus is attachable to and detachable from the display apparatus.

According to an aspect of an exemplary embodiment, there is provided a display apparatus including a connector configured to be coupled to a conversion apparatus, and receive a parallel image signal from the conversion apparatus, the display apparatus being attachable to and detachable from the conversion apparatus. The display apparatus further includes a controller configured to process the parallel image signal to display the processed parallel image signal. The display apparatus further includes image input terminals configured to be disabled in response to the display apparatus being attached to the conversion apparatus, and be enabled in response to the display apparatus being detached from the conversion apparatus.

The controller may be configured to control less than all of operations of a display system including the display apparatus, the conversion apparatus, and an image signal input apparatus coupled to the conversion apparatus, in response to the display apparatus being attached to the conversion apparatus.

According to an aspect of an exemplary embodiment, there is provided an image signal input apparatus including an input terminal configured to receive a parallel image signal. The image signal input apparatus further includes a serializer/deserializer (SerDes) configured to convert the parallel image signal to a serial image signal, and transmit the serial image signal to a conversion apparatus, the conversion apparatus being attachable to and detachable from a display apparatus. The image signal input apparatus further includes a controller configured to control operations of a display system including the image signal input apparatus, the conversion apparatus, and the display apparatus, in response to the conversion apparatus being attached to the display apparatus.

BRIEF DESCRIPTION OF THE DRAWINGS

The above and/or other aspects will be more apparent by describing in detail exemplary embodiments with reference to the accompanying drawings, in which.

DETAILED DESCRIPTION OF THE EXEMPLARY EMBODIMENTS

Figure 1:
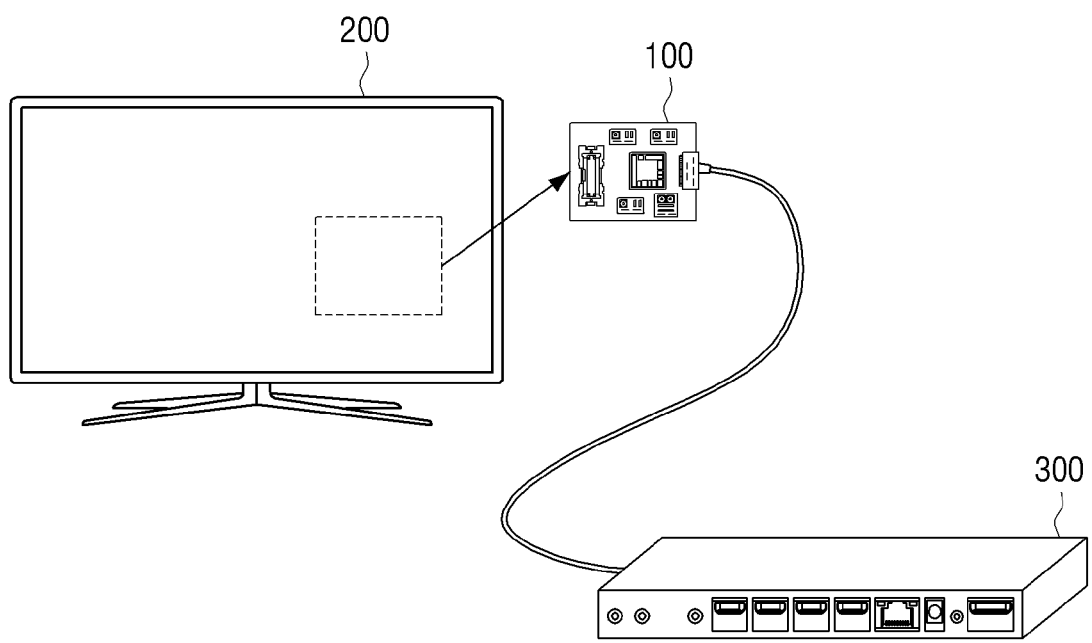
FIG. 1 is a view illustrating a display system in which a conversion apparatus for high-speed communication is detachable from a display apparatus according to an exemplary embodiment.

Exemplary embodiments are described in more detail with reference to the accompanying drawings.

In the following description, like reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

It will be understood that the terms such as "unit", "-er (-or)", and "module" described in the specification refer to an element configured to perform at least one function or operation, and may be implemented in hardware or a combination of hardware and software.

FIG. 1 is a view illustrating a display system 10 in which a conversion apparatus 100 for high-speed communication is detachable from a display apparatus 200 according to an exemplary embodiment. Referring to FIG. 1, the display system 10 includes the conversion apparatus 100, the display apparatus 200, and an image signal input apparatus 300.

The image signal input apparatus 300 may receive various types of image signals. The image signal input apparatus 300 includes input terminals of various standards that may be coupled to external apparatuses. For example, the image signal input apparatus 300 may include a High-Definition Multimedia Interface (HDMI) terminal, a USB terminal, a local area network (LAN) input terminal, and the like.

The image signal input apparatus 300 may autonomously be mounted with a central processing unit (CPU) or controller and a memory, and control all operations of the display system 10. In the display system 10 in which the image signal input apparatus 300 is coupled to the conversion apparatus 100 and the display apparatus 200, the CPU of the image signal input apparatus 300 may function as a main controller of the display system 100. A controller or CPU of the display apparatus 200, which may function as the main controller before the image signal input apparatus 300 is coupled to the conversion apparatus 100, may function as a sub-controller of the display system 10. Thus, the image signal input apparatus 300 may be upgraded, and thus an effect of upgrading all of the operations of the display system 10 may be provided.

The image signal input apparatus 300 converts an input image signal that is a parallel signal to a serial signal through an internal SerDes, and transmits the image signal converted to the serial signal. Thus, the image signal input apparatus 300 transmits the image signal in a high-speed communication manner.

The display apparatus 200 processes an input image signal, and displays the processed image signal. Since an apparatus configured to perform a high-speed communication is not included in the display apparatus 200, the display apparatus 200 includes a connector (see 210 of FIG. 4A) configured to be coupled to the conversion apparatus 100 configured to perform the high-speed communication. The display apparatus 200 autonomously includes image input terminals (see 220 of FIG. 4A) configured to receive image signals from external apparatuses.

The display apparatus 200 receives an image signal converted back to a parallel signal in the conversion apparatus 100 through low-speed communication. The display apparatus 200 processes the received image signal converted to the parallel signal, and displays the processed image signal in a single view or multiview manner.

The conversion apparatus 100 receives the image signal converted to the serial signal from the image signal input apparatus 300, and converts the received image signal back to the parallel signal. The conversion apparatus 100 transmits the image signal converted to the parallel signal to the display apparatus 200. The conversion apparatus 100 may be attachable and detachable (coupled and uncoupled) to and from the display apparatus 200. In response to high-speed SerDes communication being needed by a user, the separate conversion apparatus 100 is attached to the display apparatus 200, and the high-speed SerDes communication is used.

Figure 2:
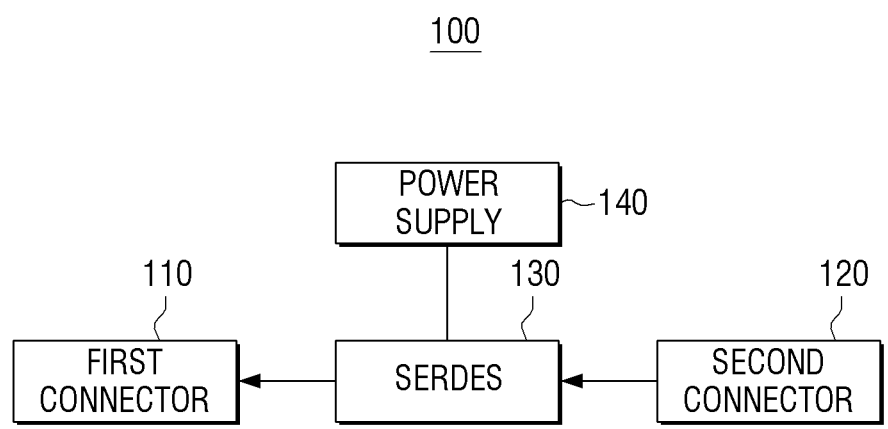
FIG. 2 is a block diagram illustrating a configuration of a conversion apparatus according to an exemplary embodiment.

FIG. 2 is a block diagram illustrating a configuration of the conversion apparatus 100 according to an exemplary embodiment. Referring to FIG. 2, the conversion apparatus 100 includes a first connector 110, a second connector 120, a SerDes 130, and a power supply 140.

The first connector 110 connects to the display apparatus 200 of FIG. 1. The first connector 110 may be coupled to the connector 210 of the display apparatus 200. Further, the first connector 110 transmits the image signal converted to the parallel signal to the display apparatus 200. For example, the first connector 110 and the connector 210 may be implemented with a configuration item (CI) connector.

The first connector 110 may communicate with the display apparatus 200 in a low-speed communication manner of less than 1 GHz. For example, the low-speed communication may be VX1 communication, Inter-Integrated Circuit (I²C) communication, universal asynchronous receiver/transmitter (UART) communication, general-purpose input/output (GPIO) communication, or transition-minimized differential signaling (TMDS) communication.

The second connector 120 connects to the image signal input apparatus 300 of FIG. 1. The second connector 120 may be coupled to the image signal input apparatus 300 through a cable. Further, the second connector 120 receives the image signal converted to the serial signal from the image signal input apparatus 300. For example, the second connector 120 may communicate with the image signal input apparatus 300 in a high-speed communication manner of 5 GHz or more.

The SerDes 130 converts a serial signal to a parallel signal. The SerDes 130 converts the image signal converted to the serial signal and received from the second connector 120, to the parallel signal. The SerDes 130 transmits the image signal converted to the parallel signal to the display apparatus 200 through the first connector 110. For example, the SerDes 130 may be implemented with a SerDes chip. An operation of the SerDes 130 will be described with reference to FIG. 3.

Figure 3:
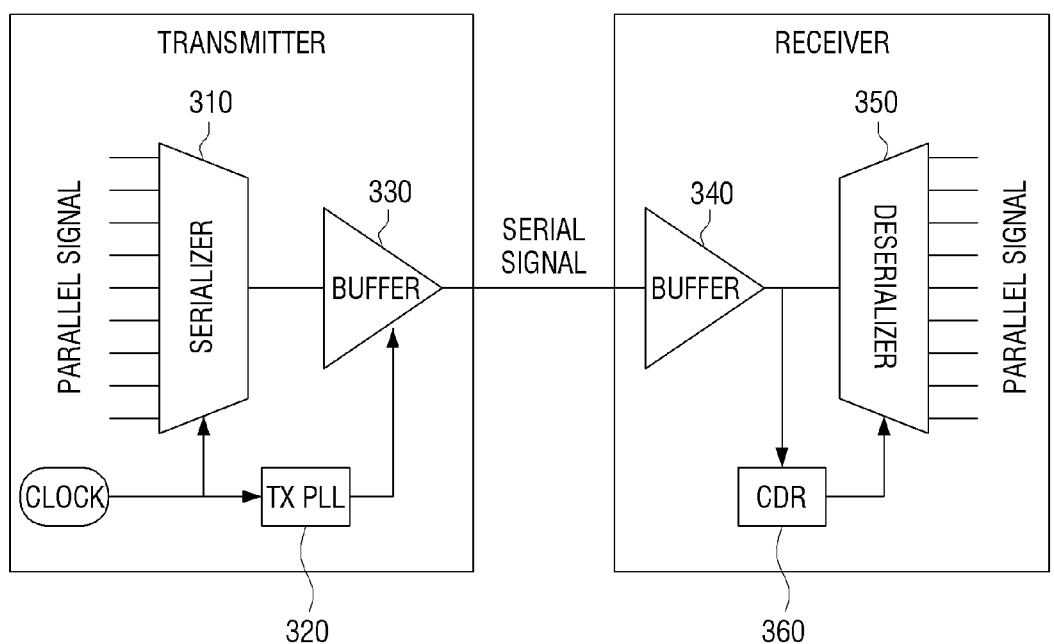
FIG. 3 is a schematic diagram illustrating a SerDes.

FIG. 3 is a schematic diagram illustrating a SerDes. The SerDes may be used in various areas of interface. For example, high-speed communication may be performed using the SerDes in serial Advanced Technology Attachment (SATA), Peripheral Component Interconnect (PCI) Express, USB, Fibre Channel, Synchronous Optical Network (SONET), a serial-attached Small Computer System Interface (SCSI), Gigabit Ethernet, Mobile Industry Processor Interface (MIPI), HDMI, Thunderbolt, and the like.

'Ser' of the SerDes indicates a serializer, and 'Des' of the SerDes indicates a deserializer. In FIG. 3, a serializer 310 converts a parallel signal to a serial signal. Since the serializer 310 is used in a transmitter, the SerDes of the image signal input apparatus 300 of FIG. 1 performs a serializer operation.

The deserializer 350 converts the input serial signal back to a parallel signal. Since the deserializer 350 is used in a receiver, the SerDes 130 of the conversion apparatus 100 of FIG. 1 performs a deserializer operation.

The SerDes 130 extracts clock information to convert the serial signal back to the parallel signal. In detail, the serializer 310 converts the parallel signal to the serial signal, and a transmission (TX) phase-locked loop (PLL) filter 320 transmits a clock signal CLOCK simultaneously with the serial signal to a buffer 330, which transmits the serial signal to a buffer 340 based on the clock signal. The buffer 340 transmits the serial signal to the deserializer 350 and a clock data recovery (CDR) module 360, which extracts the clock information from the serial signal and transmits the clock information to the deserializer 350. The deserializer 350 converts the serial signal back to the parallel signal based on the clock information.

Referring again to FIG. 2, the power supply 140 supplies power to components of the conversion apparatus 100. The power supply 140 may be implemented with a plurality of power supplies (see 140-1, 140-2, 140-3, and 140-4 of FIGS. 4A and 4B) configured to supply power having different voltages, to the components of the conversion apparatus 100. For example, a first power supply 140-1 may be a DC/DC power supply device having a voltage of 3.3 V, a second power supply 140-2 may be a DC/DC power supply device having a voltage of 1.8 V, and a third power supply 140-3 may be a DC/DC power supply device having a voltage of 1.5 V.

The plurality of power supplies may be implemented in a form that each power is separated by a bead. The bead is a passive device configured to remove noise. The bead may remove electromagnetic noise in a mobile apparatus and a digital audio/video apparatus.

The power supply 140 is autonomously included in the conversion apparatus 100 as a separate circuit to prevent interference due to power noise in response to the SerDes 130 performing high-speed communication. Since the high-speed communication is susceptible to interference due to noise, the power supply 140 is separately included in addition to separate modularization of the SerDes 130. The plurality of power supplies may be separated by a bead to further prevent high-speed communication from being interfered.

Similarly, the power supply 140 may be implemented with DC/DC power supply devices having different voltages to further prevent high-speed communication from being interfered. A single power supply designed to supply power having different voltages may interfere with high-speed communication due to noise generated in a voltage conversion operation. The SerDes 130 may select one of the plurality of power supplies that is set to supply a DC power having a voltage according to a processing function of the SerDes 130, and receive the DC power having the voltage from the selected one of the plurality of power supplies. That is, the power supply unit 140 may be implemented with the plurality of power supplies according to a number of kinds of voltages to be used in the SerDes 130.

A user may independently design a board without considering an effect of high-speed communication of the SerDes 130 in the display system 10 described above. The high-speed communication function may be provided by attaching the separately-provided conversion apparatus 100 to boards of various types of display apparatuses.

Figure 4A:
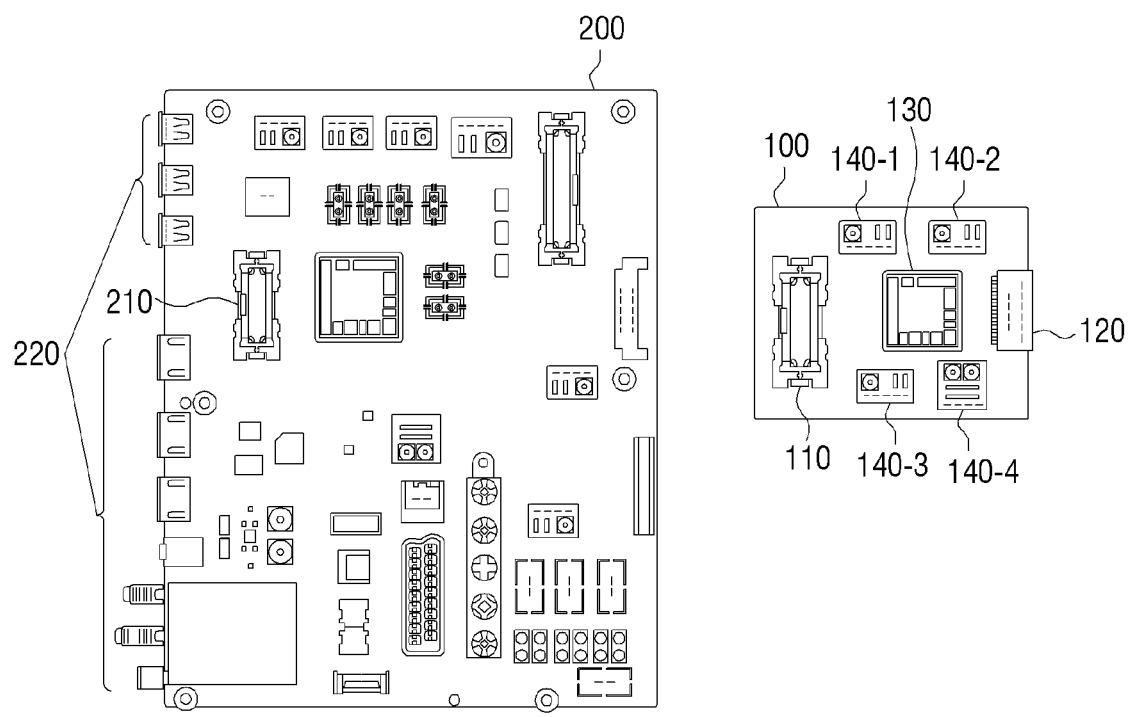
FIGS. 4A and 4B are views illustrating separation/combination of a conversion apparatus from/with a display apparatus.
Figure 4B:
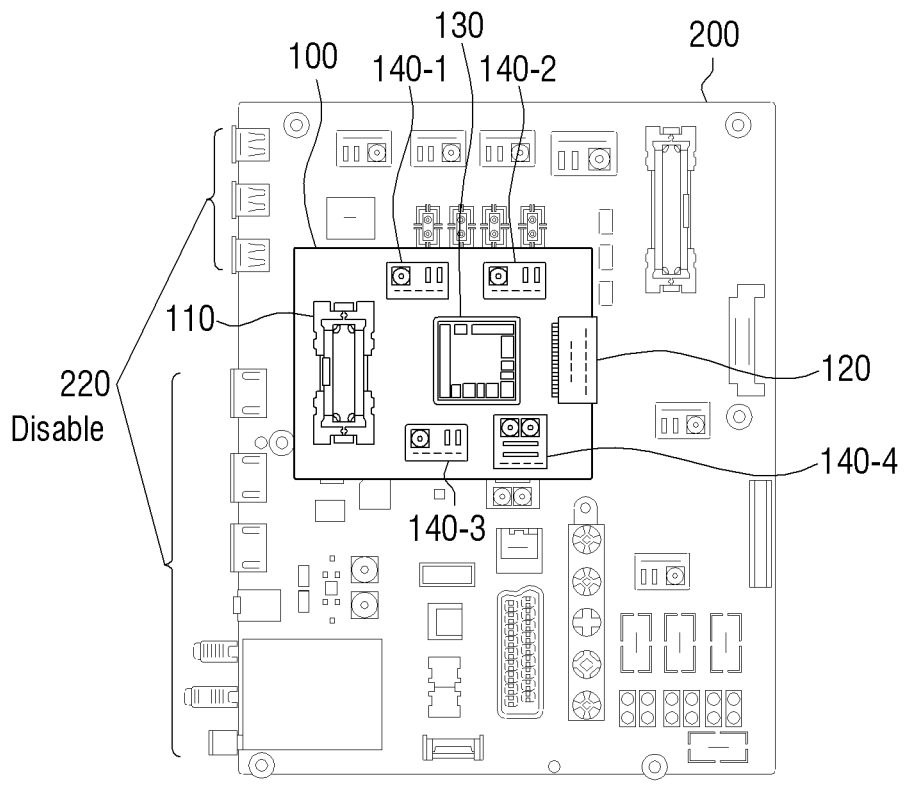

FIGS. 4A and 4B are views illustrating separation/combination of the conversion apparatus 100 from/with the display apparatus 200. FIG. 4A is a view illustrating a schematic circuit configuration of the display apparatus 200 and the conversion apparatus 100 separated from each other. Referring to FIG. 4A, the conversion apparatus 100 includes the first connector 110, the second connector 120, the SerDes 130, and the four power supplies 140-1, 140-2, 140-3, and 140-4. The first connector 110 may be coupled to the connector 210 of the display apparatus 200. The second connector 120 may be coupled to the image signal input apparatus 300 of FIG. 1 through a cable. The SerDes 130 may be implemented with a SerDes chip. The four power supplies 140-1, 140-2, 140-3, and 140-4 may be configured to supply the powers having four different voltages for the SerDes 130 to perform various functions in FIGS. 4A and 4B.

The display apparatus 200 includes the connector 210 to be coupled to the conversion apparatus 100. The display apparatus 200 autonomously includes the image input terminals 220 configured to receive image signals from external apparatuses.

FIG. 4B is a view illustrating a schematic circuit configuration in a state in which the display apparatus 200 and the conversion apparatus 100 are coupled. Referring to FIG. 4B, the first connector 110 of the conversion apparatus 100 and the connector 210 of the display apparatus 200 are coupled.

In response to the conversion apparatus 100 being coupled to the display apparatus 200, the image input terminals 220 of the display apparatus 200 are disabled.

As described above, in response to the conversion apparatus 100 and the image signal input apparatus 300 being coupled, the CPU of the display apparatus 200 controls less than all of the operations of the display system 10 of FIG. 1, but the CPU of the image signal input apparatus 300 may control all of the operations of the display system 10. Similarly, an image signal may also be input only through the image signal input apparatus 300. For smooth control of the display system 10, an operation of the display apparatus 200 may be restricted, i.e., the image input terminals 220 may be disabled.

Through the conversion apparatus 100 described above, crosstalk between a board of the display apparatus 200 and a SerDes chip may be prevented. The conversion apparatus 100 may be provided only in response to a high-speed communication of the SerDes chip being performed, and thus fabrication cost may be reduced.

In addition, the exemplary embodiments may also be implemented through computer-readable code and/or instructions on a medium, e.g., a non-transitory computer-readable medium, to control at least one processing element to implement any above-described embodiments. The medium may correspond to any medium or media which may serve as a storage and/or perform transmission of the computer-readable code.

The computer-readable code may be recorded and/or transferred on a medium in a variety of ways, and examples of the medium include recording media, such as magnetic storage media (e.g., ROM, floppy disks, hard disks, etc.) and optical recording media (e.g., compact disc read only memories (CD-ROMs) or digital versatile discs (DVDs)), and transmission media such as Internet transmission media. Thus, the medium may have a structure suitable for storing or carrying a signal or information, such as a device carrying a bitstream according to one or more exemplary embodiments. The medium may also be on a distributed network, so that the computer-readable code is stored and/or transferred on the medium and executed in a distributed fashion. Furthermore, the processing element may include a processor or a computer processor, and the processing element may be distributed and/or included in a single device.

The foregoing exemplary embodiments and advantages are merely exemplary and are not to be construed as limiting. The exemplary embodiments can be readily applied to other types of devices. Also, the description of the exemplary embodiments is intended to be illustrative, and not to limit the scope of the claims, and many alternatives, modifications, and variations will be apparent to those skilled in the art.

What is claimed is:

1. A display system comprising:
    an image signal input apparatus configured to convert a first parallel image signal to a serial image signal;
    a conversion apparatus configured to convert the serial image signal to a second parallel image signal; and
    a display apparatus configured to process the second parallel image signal, and display the processed second parallel image signal,
    wherein the conversion apparatus is attachable to and detachable from the display apparatus,
    wherein the image signal input apparatus is configured to, in response to the conversion apparatus being attached to the display apparatus, control all operations of the display system.

2. The display system as claimed in claim 1, wherein the conversion apparatus comprises:
    a first connector configured to be coupled to the display apparatus;
    a second connector configured to be coupled to the image signal input apparatus, and receive the serial image signal from the image signal input apparatus; and
    a serializer/deserializer (SerDes) configured to convert the serial image signal to the second parallel image signal,
    wherein the first connector is further configured to transmit the second parallel image signal to the display apparatus.

3. The display system as claimed in claim 2, wherein the conversion apparatus further comprises power supplies configured to supply power to the first connector, the second connector, and the SerDes.

4. The display system as claimed in claim 3, wherein the power supplies are separated by a bead.

5. The display system as claimed in claim 3, wherein each supplied power has a different voltage, and
    the SerDes is configured to select one of the power supplies configured to supply a power having a voltage based on a processing function of the SerDes, and receive the power having the voltage from the selected one of the power supplies.

6. The display system as claimed in claim 2, wherein the first connector is configured to perform low-speed communication of less than 1 GHz, and
    the second connector is configured to perform high-speed communication of 5 GHz or more.

7. The display system as claimed in claim 6, wherein the low-speed communication is any one or any combination of VX1 communication, inter-integrated circuit communication, universal asynchronous receiver/transmitter communication, general purpose input/output communication, and transition-minimized differential signaling communication.

8. The display system as claimed in claim 1, wherein the display apparatus comprises image input terminals configured to be disabled in response to the conversion apparatus being attached to the display apparatus, and be enabled in response to the conversion apparatus being detached from the display apparatus.

9. The display system as claimed in claim 1, wherein the display apparatus is configured to, in response to the conversion apparatus being attached to the display apparatus, control less than all of the operations of the display system.

10. A conversion apparatus comprising:
    a first connector configured to be coupled to a display apparatus;
    a second connector configured to be coupled to an image signal input apparatus, and receive a serial image signal from the image signal input apparatus; and
    a serializer/deserializer (SerDes) configured to convert the serial image signal to a parallel image signal,
    wherein the first connector is further configured to transmit the parallel image signal to the display apparatus,
    the conversion apparatus is attachable to and detachable from the display apparatus, and
    wherein the image signal input apparatus is configured to, in response to the conversion apparatus being attached to the display apparatus, control all operations of a display system comprising the display apparatus and the conversion apparatus.

11. The conversion apparatus as claimed in claim 10, further comprising power supplies configured to supply power to the first connector, the second connector, and the SerDes.

12. The conversion apparatus as claimed in claim 11, wherein the power supplies are separated by a bead.

13. The conversion apparatus as claimed in claim 11, wherein each supplied power has a different voltage, and the SerDes is configured to select one of the power supplies configured to supply a power having a voltage based on a processing function of the SerDes, and receive the power having the voltage from the selected one of the power supplies.

14. The conversion apparatus as claimed in claim 10, wherein the first connector is configured to perform low-speed communication of less than 1 GHz, and the second connector is configured to perform high-speed communication of 5 GHz or more.

15. The conversion apparatus as claimed in claim 14, wherein the low-speed communication is any one or any combination of VX1 communication, inter-integrated circuit communication, universal asynchronous receiver/transmitter communication, general purpose input/output communication, and transition-minimized differential signaling communication.

16. A display apparatus comprising:

a connector configured to be coupled to a conversion apparatus, and receive a parallel image signal from the conversion apparatus, the display apparatus being attachable to and detachable from the conversion apparatus;

a controller configured to process the parallel image signal to display the processed parallel image signal; and image input terminals configured to be disabled in response to the display apparatus being attached to the conversion apparatus, and be enabled in response to the display apparatus being detached from the conversion apparatus; and an image signal input apparatus coupled to the conversion apparatus, wherein the image signal input apparatus is configured to, in response to the conversion apparatus being attached to the display apparatus, control all operations of a display system comprising the display apparatus and the conversion apparatus.

17. The display apparatus of claim 16, wherein the controller is configured to control less than all of operations of the display system.

18. An image signal input apparatus comprising:

an input terminal configured to receive a parallel image signal;

a serializer/deserializer (SerDes) configured to convert the parallel image signal to a serial image signal, and transmit the serial image signal to a conversion apparatus, the conversion apparatus being attachable to and detachable from a display apparatus; and a controller configured to control all operations of a display system comprising the conversion apparatus and the display apparatus, in response to the conversion apparatus being attached to the display apparatus.

19. The display system of claim 1, wherein the controlling operations of the display system comprises controlling a serializer/deserializer (SerDes) and a plurality of power supplies.

20. A display system comprising:

an image signal input apparatus configured to convert a first parallel image signal to a serial image signal;

a conversion apparatus configured to convert the serial image signal to a second parallel image signal; and a display apparatus configured to process the second parallel image signal, and display the processed second parallel image signal, wherein the conversion apparatus is attachable to and detachable from the display apparatus, and wherein the image signal input apparatus is configured to, in response to the conversion apparatus being attached to the display apparatus, control all of operations of the display system, and the display apparatus is configured to, in response to the conversion apparatus being attached to the display apparatus, control less than all of the operations of the display system.

* * * * *